United States Patent [19]
Otsuki

[11] 3,933,121
[45] Jan. 20, 1976

[54] TV CHANNEL NUMBER INDICATOR
[75] Inventor: Akira Otsuki, Kakuda, Japan
[73] Assignee: Alps Electric Co., Ltd., Tokyo, Japan
[22] Filed: June 6, 1973
[21] Appl. No.: 367,372

[30] Foreign Application Priority Data
June 24, 1972 Japan.............................. 47-74547

[52] U.S. Cl.... 116/124.2 R; 74/10.41; 116/DIG. 30; 334/86
[51] Int. Cl.² .......................................... H03J 1/02
[58] Field of Search ............ 116/124.1 A, 124.1 R, 124.2 R, 116/DIG. 30; 334/86–88; 74/10.41

[56] References Cited
UNITED STATES PATENTS

| | | | |
|---|---|---|---|
| 2,620,672 | 12/1952 | McMahon | 74/10.41 |
| 2,983,885 | 5/1961 | Thompson | 334/86 X |
| 3,234,801 | 2/1966 | Valdettaro et al. | 74/10.41 |
| 3,285,078 | 11/1966 | Siebold | 116/124.1 R |
| 3,489,029 | 1/1970 | Cappelle et al. | 74/10.41 X |
| 3,561,287 | 2/1971 | Lawrence, Jr. | 74/10.41 X |
| 3,618,560 | 11/1971 | Aoki | 334/86 |
| 3,857,360 | 12/1974 | Tonari et al. | 116/124.2 R |

*Primary Examiner*—Richard C. Queisser
*Assistant Examiner*—Daniel M. Yasich

[57] ABSTRACT

A TV channel number indicator used for a TV tuner has first and second indicators with a rotation stepdown gear mechanism interposed therebetween, first and second intermittent locking cams rotating with said indicators and forming parts of said gear mechanism, spring means being urged into contact with the peripheries of the cams to give intermittent locking rotation to the cams and to the indicators.

10 Claims, 3 Drawing Figures

TV CHANNEL NUMBER INDICATOR

BACKGROUND OF THE INVENTION

The invention relates to a channel number indicator and, more particularly, to a TV channel number indicator of two digits adapted to be used for a UHF TV tuner.

It is a general object of the present invention to provide a channel number indicator of a novel arrangement.

It is a specific object of the present invention to provide a TV channel number indicator adapted to be incorporated in a TV tuner which indicates a channel number precisely and stably in response to operation of a tuner and which can be constructed in a remarkably small size and modified freely relative to its outer appearance.

Other objects and advantages of the present invention will become clear as the description proceeds.

SUMMARY OF THE INVENTION

According to the present invention, there is provided a novel channel number indicator used for a TV tuner, particularly adapted to be incorporated in a UHF TV tuner, which comprises a drive shaft to be rotated by the TV tuner, a first digit indicator rotated by the drive shaft, a second digit indicator supported rotatably concentric with the first digit indicator, a first cam having one internal gear tooth rotated together with the first digit indicator, a second cam of essentially the same shape as that of the first cam having an internal gear portion secured to the second digit indicator, spring means urged into contact with the peripheries of the first and second cams to give intermittent locking rotation effect to the first and second digit indicators, and gear means in gear with the one internal gear tooth of the first place and the internal gear portion of the second plate for rotation at step-down driving of the second indicator from the first indicator, whereby every rotation of the first digit indicator causes a predetermined angle of rotation in the second digit indicator. The two indicators are arranged preferably in substantially the same plane, one being in ring form and surrounding the other, the second indicator preferably being freely rotatably mounted on the drive shaft, and preferably between the first indicator and the first cam.

DESCRIPTION OF THE PREFERRED EMBODIMENT

Figure 1:
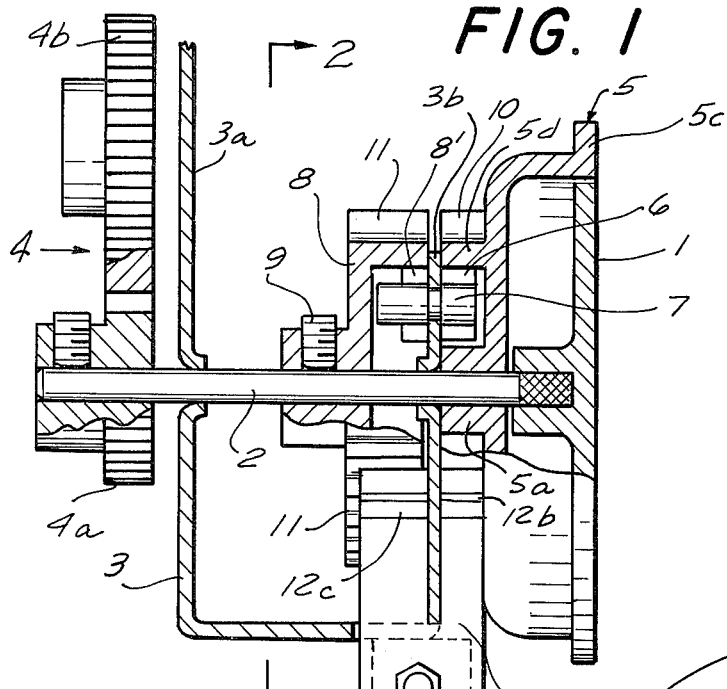
FIG. 1 is a side view of an embodiment of a channel number indicator constructed in accordance with the present invention with a portion shown in cross-sectional view.
Figure 2:
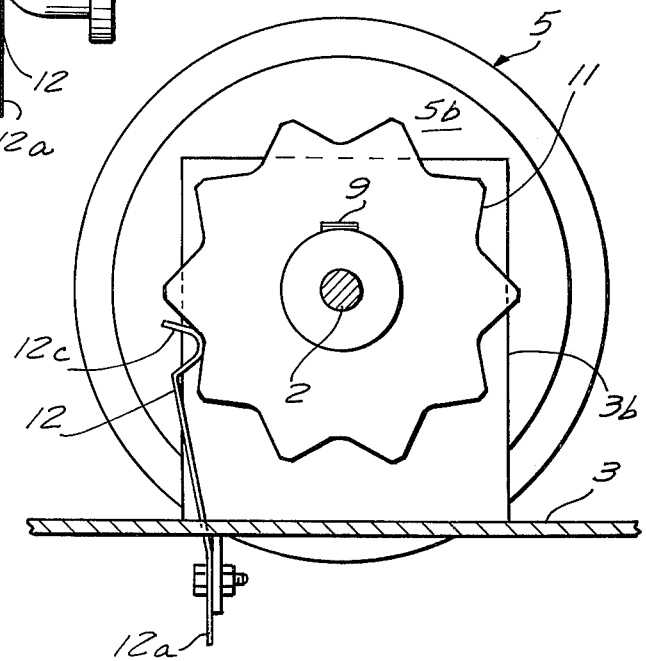
FIG. 2 is a rear view of the indicator, looking in the arrow 2 direction in FIG. 1.
Figure 3:
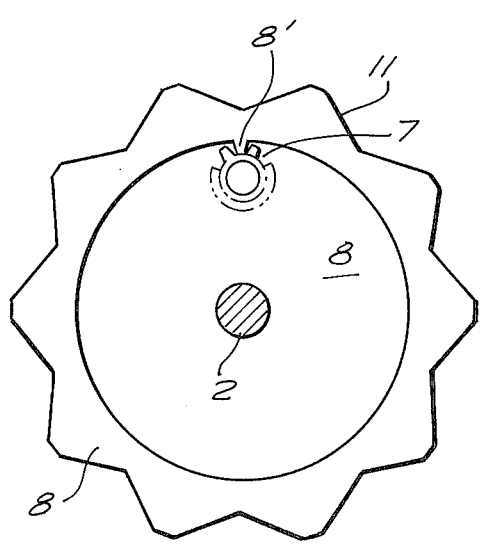
FIG. 3 is an explanatory view of a gear section of a carry mechanism.

Referring to the drawings showing an embodiment of the present invention, there is a first digit indicator in the form of plate 1 to which a drive shaft 2 is coupled. The drive shaft 2 is supported rotatably by mounting frame 3, being journalled in spaced frame arms 3a and 3b. It is rotated by a channel change-over shaft of a TV tuner through gear mechanism 4, the gear 4a of which is fast on shaft 2 and the gear 4b of which is adapted to be driven by the tuner selector mechanism (not shown). A second digit indicator in the form of ring-shaped plate 5 is rotatably supported on the drive shaft 2 by means of hub portion 5a and radially outwardly extending part 5b. Its digit carrying surface 5c facing outwardly, is ring-shaped to surround indicator 1, and preferably is in the same plane as indicator 1. A rearwardly extending portion 5d thereof is formed with an internal gear 6 integral therewith. A carry gear 7 is rotatably supported by frame arm 3b and is in gear with the internal gear 6 of the second digit indicator. There is another member 8 which is fixed to the drive shaft 2 by means of a screw 9. It has an internal gear 8' consisting of one gear tooth that is in operative meshing rotation with the carry gear 7, and which functions to rotate the second digit indicator 5 a predetermined angle for every rotation of the first digit indicator 1 through the intermediate carry gear 7. Intermittent locking cams 10 and 11, each having essentially the same shape with ten teeth, are provided, the cam 10 being formed on the exterior of the portion 5d of the second digit indicator 5 and the cam 11 being formed on the exterior of the gear 8 carrying the single internal gear tooth 8'. A spring 12 is disposed in operative relation to these cams 10 and 11. Its base portion 12a is secured to the mounting frame 3 and it has divided distal ends 12b and 12c which are urged against the cams 10 and 11, respectively. The mechanism comprising the cams 10 and 11 and the spring 12 effectively prevents rattling or vibration of the first and second digit indicators 1 and 5 and to eliminate positional offset in indicating the first and second digits.

As will be understood from the foregoing description of the construction of the present invention, when the drive shaft 2 is rotated by means of the channel change-over shaft of a TV tuner through the gear mechanism 4, the first or "units" digit indicator 1 is rotated to indicate a new "units" digit. At this time, in response to rotation of the drive shaft 2, the gear 8 is also rotated; but, if the internal gear 8' does not actually mesh with the gear 7, the second digit indicator 5 will not rotate.

In this way, as the drive shaft 2 rotates, the indication of the "units" digit is effected successively by operation of the first digit indicator 1, gear 8, cam 11, and spring 12 which is in urged contact with cam 11 to produce intermittent locking rotation effect. Spring 12 also acts on cam 10 to retain the second digit indicator 5 stationary.

As the first digit indicator 1 rotates one complete rotation together with the gear 8, the single tooth 8' of the gear 8 comes into meshing engagement with the gear 7 and rotates the latter a predetermined angle. As a result, the second digit indicator 5, whose internal gear 6 is in mesh with carry gear 7, rotates a predetermined angle to change the "tens" indication. Accordingly, as the first digit indicator 1 and the gear 8 are rotated, two-digit indication is successively presented by means of the indicating plates 1 and 5.

When a carry is produced, the angles of rotation of the indicators 1 and 5 are confined by the cams 10 and 11 of the gears 6 and 8 and the spring 12 in urged contact with the cams, so that deviation of indicating positions of the first and second digits from desired locations is effectively eliminated.

As described above, according to the present invention, the channel number can be precisely and stably indicated because no deviation of indicating positions of the first and second digits occurs, the carry mechanism intermediate between the first and second digit mechanisms can be disposed in rear of the indicating plates, because the first and second indicating plates are arranged concentric with and in the same plane as one another, the overall channel number indicating mechanism can be miniaturized to make it simple to design a TV set or tuner, and modification of the size and appearance of the indicating plates can be easily achieved.

While but a single embodiment of the present invention has been herein specifically disclosed, it will be appreciated that many variations may be made therein without departing from the scope of the invention, as defined in the following claims.

I claim:

1. A TV channel number indicator for use with a TV tuner, said indicator comprising a frame, a drive shaft mounted on said frame, means for drivingly connecting said shaft to a TV tuner, a first digit indicator operatively connected to said drive shaft so as to be rotated thereby, a second digit indicator rotatably disposed on said frame concentric with said first digit indicator, a first external intermittent locking cam operatively connected to said drive shaft and having a first internal gear consisting of at least one isolated gear tooth secured to said first digit indicator, a second external intermittent locking cam with a second internal gear secured to said second digit indicating plate, spring means mounted on said frame and resiliently engaging said first and second cams to permit intermittent locking rotation action of said cams, and gear means mounted on said frame and in gear with said first and second internal gears, whereby in response to every rotation of said first digit indicator said second digit indicator is rotated a predetermined angle.

2. A TV channel number indicator as set forth in claim 1 wherein said second intermittent locking cam is formed integral with said second digit indicator.

3. A TV channel number indicator as set forth in claim 2 wherein said second digit indicator has a digit indicating portion facing away from one end thereof, said second intermittent locking cam extending therefrom in the direction of the other end thereof.

4. A TV channel number indicator as set forth in claim 2 wherein said spring means is in the form of a single spring having a base portion secured to said frame and having a distal end portion divided into first and second parts that are urged into contact with said first and second cams, respectively.

5. A TV channel number indicator as set forth in claim 3 wherein said spring means is in the form of a single spring having a base portion secured to said frame and having a distal end portion divided into first and second parts that are urged into contact with said first and second cams, respectively.

6. A TV channel number indicator as set forth in claim 1 wherein said second digit indicator has a digit indicating portion facing away from one end thereof, said second intermittent locking cam extending therefrom in the direction of the other end thereof.

7. A TV channel number indicator as set forth in claim 1 wherein said spring means is in the form of a single spring having a base portion secured to said frame and having a distal end portion divided into first and second parts that are urged into contact with said first and second cams, respectively.

8. A TV channel number indicator as set forth in Claim 1, in which said digit indicators are in substantially the same plane, one of said digit indicators comprising a ring and the other comprising a part located inside said ring.

9. A TV channel number indicator as set forth in claim 1, in which said second digit indicator is freely rotatably mounted on said drive shaft.

10. The TV channel number indicator as set forth in claim 1, in which said frame comprises a part interposed between said digit indicators and said second intermittent locking cam, said drive shaft being rotatably mounted in said frame part and said gear means being mounted on said frame part.

* * * * *